US010930591B2

(12) United States Patent
Guan et al.

(10) Patent No.: US 10,930,591 B2
(45) Date of Patent: Feb. 23, 2021

(54) TRENCH MOSFET WITH SELF-ALIGNED BODY CONTACT WITH SPACER

(71) Applicant: VISHAY-SILICONIX, San Jose, CA (US)

(72) Inventors: Lingpeng Guan, San Jose, CA (US); Kyle Terrill, Santa Clara, CA (US); Seokjin Jo, San Jose, CA (US)

(73) Assignee: Vishay-Siliconix, LLC, San Jose, CA (US)

( * ) Notice: Subject to any disclaimer, the term of this patent is extended or adjusted under 35 U.S.C. 154(b) by 0 days.

(21) Appl. No.: 16/375,222

(22) Filed: Apr. 4, 2019

(65) Prior Publication Data
US 2019/0237403 A1    Aug. 1, 2019

Related U.S. Application Data

(62) Division of application No. 15/263,882, filed on Sep. 13, 2016.
(Continued)

(51) Int. Cl.
| H01L 29/66 | (2006.01) |
| H01L 23/528 | (2006.01) |
| H01L 29/417 | (2006.01) |
| H01L 29/78 | (2006.01) |
| H01L 29/08 | (2006.01) |
| H01L 29/10 | (2006.01) |
| H01L 29/45 | (2006.01) |
| H01L 29/40 | (2006.01) |

(52) U.S. Cl.
CPC ...... *H01L 23/5283* (2013.01); *H01L 29/0869* (2013.01); *H01L 29/1095* (2013.01); *H01L 29/41766* (2013.01); *H01L 29/456* (2013.01); *H01L 29/66719* (2013.01); *H01L 29/66727* (2013.01); *H01L 29/66734* (2013.01); *H01L 29/7813* (2013.01); *H01L 29/407* (2013.01)

(58) Field of Classification Search
CPC ......... H01L 29/66712; H01L 29/66719; H01L 29/66727
See application file for complete search history.

(56) References Cited

U.S. PATENT DOCUMENTS 5,472,897 A    12/1995  Hsu et al.
7,345,342 B2    3/2008  Challa et al.
(Continued)

FOREIGN PATENT DOCUMENTS

| CN | 1941417 | 4/2007 |
| CN | 101009328 | 8/2007 |
(Continued)

*Primary Examiner* — Jae Lee

(57) ABSTRACT

Trench MOSFET with self-aligned body contact with spacer. In accordance with an embodiment of the present invention, a plurality of gate trenches are formed into a semiconductor substrate. A body contact trench is formed into the semiconductor substrate in a mesa between the gate trenches. Spacers are deposited on sidewalls of the body contact trench. An ohmic body contact is implanted into the semiconductor substrate through the body contact trench utilizing the spacers to self-align the implant. A body contact trench extension may be etched into the semiconductor substrate through the body contact trench utilizing the spacers to self-align the etch, prior to the implant.

20 Claims, 3 Drawing Sheets

Related U.S. Application Data

(60) Provisional application No. 62/243,502, filed on Oct. 19, 2015.

(56) References Cited

U.S. PATENT DOCUMENTS

| | | | |
|---|---|---|---|
| 7,375,029 B2 | 5/2008 | Poelzl | |
| 7,544,571 B2 | 6/2009 | Park | |
| 7,598,143 B2 | 10/2009 | Zundel et al. | |
| 7,629,646 B2 | 12/2009 | Hshieh | |
| 7,800,170 B1 | 9/2010 | He et al. | |
| 7,816,720 B1 | 10/2010 | Hsieh | |
| 8,629,505 B2 | 1/2014 | Nishiwaki | |
| 8,686,493 B2 | 4/2014 | Thorup et al. | |
| 8,779,510 B2 | 7/2014 | Yilmaz et al. | |
| 9,257,549 B2 | 2/2016 | Hirler | |
| 2005/0167695 A1* | 8/2005 | Yilmaz | H01L 29/0619 257/134 |
| 2005/0167742 A1 | 8/2005 | Challa et al. | |
| 2008/0042194 A1* | 2/2008 | Hshieh | H01L 29/78 257/331 |
| 2008/0042222 A1 | 2/2008 | Hshieh | |
| 2008/0076222 A1 | 3/2008 | Zundel et al. | |
| 2008/0149989 A1* | 6/2008 | Cheng | H01L 29/0878 257/331 |
| 2009/0189218 A1 | 7/2009 | Pan | |
| 2009/0246923 A1 | 10/2009 | Park | |
| 2010/0090274 A1* | 4/2010 | Hsieh | H01L 29/0878 257/331 |
| 2010/0171173 A1 | 7/2010 | Hsieh | |
| 2011/0124167 A1 | 5/2011 | Hu et al. | |
| 2011/0136310 A1 | 6/2011 | Grivna | |
| 2011/0233606 A1* | 9/2011 | Hsieh | H01L 29/0626 257/139 |
| 2011/0254086 A1 | 10/2011 | Hsieh | |
| 2012/0043606 A1 | 2/2012 | Sato et al. | |
| 2012/0061753 A1 | 3/2012 | Nishiwaki | |
| 2012/0267704 A1 | 10/2012 | Siemieniec et al. | |
| 2012/0305985 A1 | 12/2012 | Hsieh | |
| 2013/0049072 A1 | 2/2013 | Heineck et al. | |
| 2013/0049104 A1 | 2/2013 | Tai et al. | |
| 2014/0184306 A1* | 7/2014 | Zundel | H01L 29/66727 257/139 |
| 2015/0214355 A1 | 7/2015 | Nakano et al. | |
| 2015/0221765 A1 | 8/2015 | Zeng et al. | |
| 2016/0197176 A1 | 7/2016 | Stefanov et al. | |
| 2017/0110404 A1 | 4/2017 | Guan et al. | |

FOREIGN PATENT DOCUMENTS

| | | |
|---|---|---|
| CN | 201725795 | 1/2011 |
| CN | 101989602 | 3/2011 |
| CN | 102738215 | 10/2012 |
| CN | 103545364 | 1/2014 |
| CN | 103594515 | 2/2014 |
| CN | 104282645 | 1/2015 |
| CN | 104795446 | 7/2015 |
| JP | 3279151 | 5/1997 |
| JP | 3279151 | 4/2002 |
| WO | 2009079465 | 6/2009 |
| WO | 2014115280 | 7/2014 |

* cited by examiner

200

Start

↓

210 FORM A PLURALITY OF GATE TRENCHES INTO A SEMICONDUCTOR SUBSTRATE

↓

220 FORM A BODY CONTACT TRENCH INTO THE SEMICONDUCTOR SUBSTRATE IN A MESA BETWEEN THE GATE TRENCHES

↓

230 DEPOSIT SPACERS ON EDGES OF THE BODY CONTACT TRENCH

↓

240 ETCH A BODY CONTACT TRENCH EXTENSION INTO THE SEMICONDUCTOR SUBSTRATE THROUGH THE BODY CONTACT TRENCH UTILIZING THE SPACERS TO SELF-ALIGN THE ETCH

↓

250 IMPLANT AN OHMIC BODY CONTACT INTO THE SEMICONDUCTOR SUBSTRATE THROUGH THE BODY CONTACT TRENCH UTILIZING THE SPACERS TO SELF-ALIGN THE IMPLANTING

↓

260 REMOVE THE SPACERS

↓

Finish

Fig. 2

TRENCH MOSFET WITH SELF-ALIGNED BODY CONTACT WITH SPACER

RELATED APPLICATIONS

This Application is a Divisional Application of co-pending, commonly owned U.S. patent application Ser. No. 15/263,882, Attorney Docket VISH-8817, entitled "Trench MOSFET with Self-Aligned Body Contact with Spacer," to Guan, et al., filed Sep. 13, 2016, which in turn claims the benefit of U.S. Provisional Application No. 62/243,502, filed Oct. 19, 2015. All such applications are hereby incorporated herein by reference in their entireties.

This Application is related to co-pending, commonly owned U.S. patent application Ser. No. 13/460,567, filed Apr. 20, 2012, to Bobde et al., entitled "Hybrid Split Gate Semiconductor," which is hereby incorporated herein by reference in its entirety.

This Application is related to co-pending, commonly owned U.S. patent application Ser. No. 14/058,933, filed Oct. 21, 2013, to Terrill and Guan, entitled "Semiconductor Structure with High Energy Dopant Implantation," which is hereby incorporated herein by reference in its entirety.

This Application is related to commonly owned U.S. patent application Ser. No. 14/058,933, now abandoned, filed Oct. 21, 2013, to Terrill and Guan, entitled "Semiconductor Structure with High Energy Dopant Implantation," which is hereby incorporated herein by reference in its entirety.

FIELD OF INVENTION

Embodiments of the present invention relate to the field of integrated circuit design and manufacture. More specifically, embodiments of the present invention relate to systems and methods for a trench MOSFET with self-aligned body contact with spacer.

BACKGROUND

Conventional trench MOSFETs do not substantially benefit from decreases in process geometry, e.g., a decrease in the pitch between trenches. Sub-micron cell pitch scaling is generally desirable for increasing the channel density, which in turn decreases the channel resistance per unit area. However, such scaling may also result in an undesirable narrower mesa width per unit area, which may increase the drift region resistance. In addition, due to the decreased mesa width, the distance between the channel region and the body contact is deleteriously decreased, which may cause an undesirable increase in threshold voltage.

SUMMARY OF THE INVENTION

Therefore, what is needed are systems and methods for trench metal-oxide-semiconductor field-effect transistors (MOSFETs) with self-aligned body contacts. An additional need exists for systems and methods for trench MOSFETs with self-aligned body contacts having increased separation between a body contact implant and a gate trench. What is further needed are systems and methods for trench MOSFETs with self-aligned body contacts having improved performance at finer, e.g., smaller, inter-gate pitch dimensions. A still further need exists for systems and methods for trench MOSFETs with self-aligned body contacts that are compatible and complementary with existing systems and methods of integrated circuit design, manufacturing and test. Embodiments of the present invention provide these advantages.

In accordance with an embodiment of the present invention, a semiconductor device includes a semiconductor substrate, and at least two gate trenches formed in the semiconductor substrate. Each of the trenches comprises a gate electrode. The semiconductor device also includes a body contact trench formed in the semiconductor substrate between the gate trenches. The body contact trench has a lower width at the bottom of the body contact trench and an ohmic body contact implant beneath the body contact trench. The horizontal extent of the ohmic body contact implant is not greater than the lower width of the body contact trench.

In accordance with another embodiment of the present invention, a semiconductor device includes a semiconductor substrate, and at least two gate trenches formed in the semiconductor substrate. Each of the trenches comprises a gate electrode. The semiconductor device also includes a body contact trench formed in the semiconductor substrate between the gate trenches. The body contact trench is characterized as having a substantially constant sidewall slope to a first depth. The semiconductor device further includes a body contact trench extension formed in the semiconductor substrate extending from the bottom of the body contact trench. A sidewall of the body contact trench extension is disjoint with the sidewall slope of the body contact trench. The semiconductor device includes an ohmic body contact implant beneath the body contact trench extension. The horizontal extent of the ohmic body contact implant is not greater than the width of the body contact trench at the first depth.

In accordance with a first method embodiment of the present invention, a plurality of gate trenches are formed into a semiconductor substrate. A body contact trench is formed into the semiconductor substrate in a mesa between the gate trenches. Spacers are deposited on sidewalls of the body contact trench. An ohmic body contact is implanted into the semiconductor substrate through the body contact trench utilizing the spacers to self-align the implant. A body contact trench extension may be etched into the semiconductor substrate through the body contact trench utilizing the spacers to self-align the etch, prior to the implant.

BRIEF DESCRIPTION OF THE DRAWINGS

The accompanying drawings, which are incorporated in and form a part of this specification, illustrate embodiments of the invention and, together with the description, serve to explain the principles of the invention. Unless otherwise noted, the drawings are not drawn to scale.

FIG. 2 illustrates an exemplary method, in accordance with embodiments of the present invention.

DETAILED DESCRIPTION

Figure 1A:
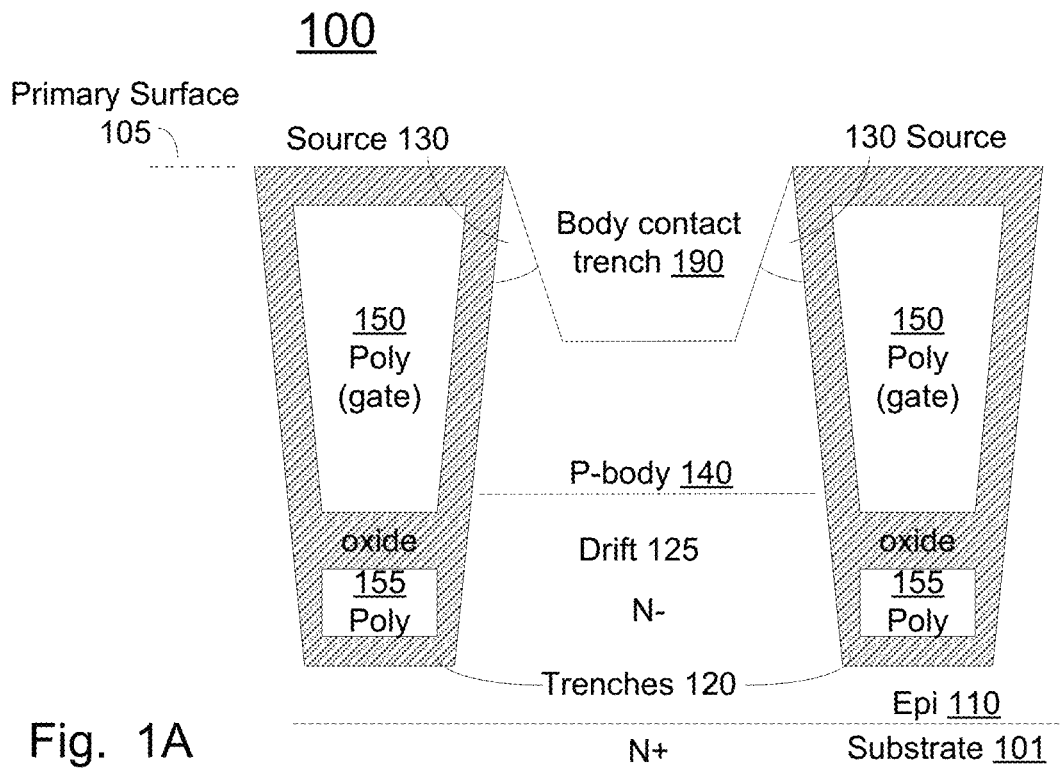
FIG. 1A illustrates a semiconductor wafer in an intermediate state of manufacture, in accordance with embodiments of the present invention.

Reference will now be made in detail to various embodiments of the invention, examples of which are illustrated in the accompanying drawings. While the invention will be described in conjunction with these embodiments, it is understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, it will be recognized by one of ordinary skill in the art that the invention may be practiced without these specific details. In other instances, well known methods, procedures, components, and circuits have not been described in detail as not to unnecessarily obscure aspects of the invention.

Notation and Nomenclature

Some portions of the detailed descriptions which follow, e.g., process 200, are presented in terms of procedures, steps, logic blocks, processing, operations and other symbolic representations of operations on data bits that may be performed on computer memory. These descriptions and representations are the means used by those skilled in the data processing arts to most effectively convey the substance of their work to others skilled in the art. A procedure, computer executed step, logic block, process, operation, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "forming" or "depositing" or "implanting" or "etching" or "processing" or "singulating" or "filling" or "roughening" or "accessing" or "performing" or "generating" or "adjusting" or "creating" or "executing" or "continuing" or "indexing" or "computing" or "translating" or "calculating" or "determining" or "measuring" or "gathering" or "running" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The figures are not drawn to scale, and only portions of the structures, as well as the various layers that form those structures, may be shown in the figures. Furthermore, fabrication processes and operations may be performed along with the processes and operations discussed herein; that is, there may be a number of process operations before, in between and/or after the operations shown and described herein. Importantly, embodiments in accordance with the present invention can be implemented in conjunction with these other (perhaps conventional) processes and operations without significantly perturbing them. Generally speaking, embodiments in accordance with the present invention may replace and/or supplement portions of a conventional process without significantly affecting peripheral processes and operations.

As used herein, the letter "n" refers to an n-type dopant and the letter "p" refers to a p-type dopant. A plus sign "+" or a minus sign "−" is used to represent, respectively, a relatively high or relatively low concentration of such dopant(s).

The term "channel" is used herein in the accepted manner. That is, current moves within a FET in a channel, from the source connection to the drain connection. A channel can be made of either n-type or p-type semiconductor material; accordingly, a FET is specified as either an n-channel or p-channel device. Some of the figures are discussed in the context of an n-channel device, specifically an n-channel vertical MOSFET; however, embodiments according to the present invention are not so limited. That is, the features described herein may be utilized in a p-channel device. The discussion of an n-channel device can be readily mapped to a p-channel device by substituting p-type dopant and materials for corresponding n-type dopant and materials, and vice versa.

The term "trench" has acquired two different, but related meanings within the semiconductor arts. Generally, when referring to a process, e.g., etching, the term trench is used to mean or refer to a void of material, e.g., a hole or ditch. Generally, the length of such a hole is much greater than its width or depth. However, when referring to a semiconductor structure or device, the term trench is used to mean or refer to a solid vertically-aligned structure, disposed beneath a surface of a substrate, having a complex composition, different from that of the substrate, and usually adjacent to a channel of a field effect transistor (FET). The structure comprises, for example, a gate of the FET. Accordingly, a trench semiconductor device generally comprises a mesa structure, which is not a trench, and portions, e.g., one half, of two adjacent structural "trenches."

It is to be appreciated that although the semiconductor structure commonly referred to as a "trench" may be formed by etching a trench and then filling the trench, the use of the structural term herein in regards to embodiments of the present invention does not imply, and is not limited to such processes.

Trench MOSFET with Self-Aligned Body Contact with Spacer

Figure 1B:
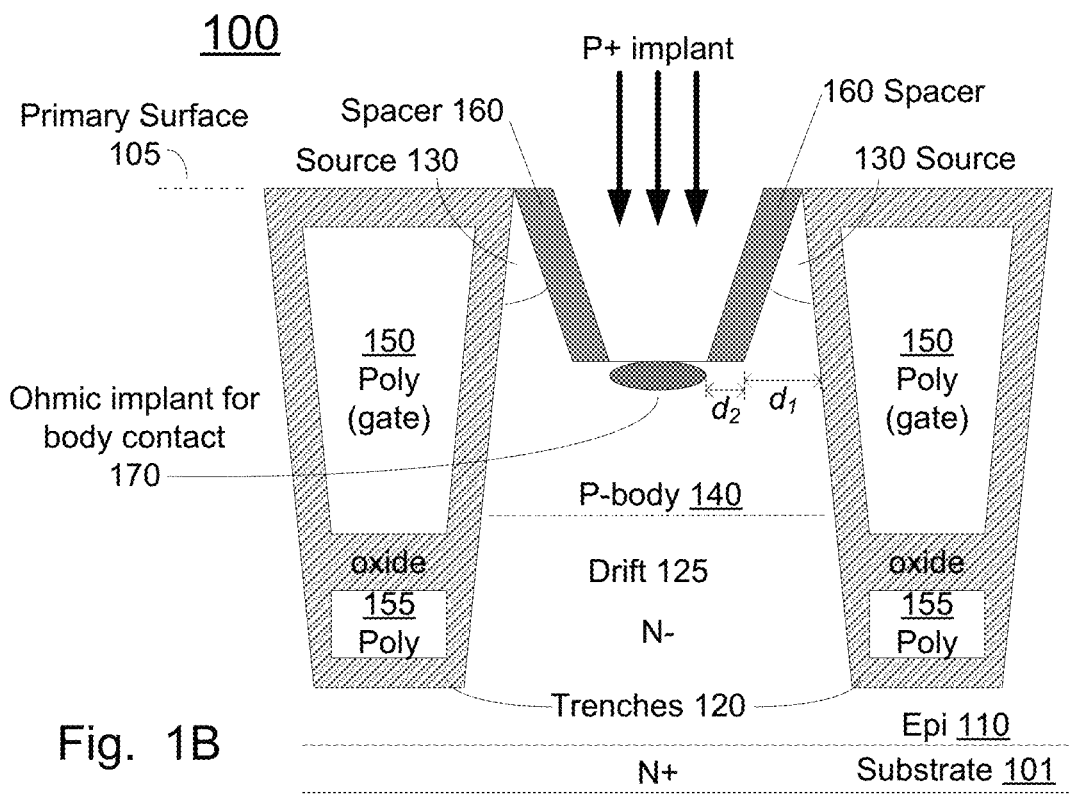
FIG. 1B illustrates a self-aligned implant of an ohmic body contact, in accordance with embodiments of the present invention.

FIGS. 1A and 1B illustrate an exemplary method of forming a trench metal oxide semiconductor field effect transistor (MOSFET) with self-aligned body contact 100, in accordance with embodiments of the present invention. FIG. 1A illustrates a portion of an exemplary semiconductor device 100. In FIG. 1A, a semiconductor wafer has been brought to an intermediate state by well known methods. For example, an N-type epitaxial layer, e.g., epitaxial layer 110, is grown over a heavily doped N+ silicon substrate, e.g., substrate 101. A hard mask oxide is grown and a photolithographic process is used to pattern a photo resist in all areas outside the trench region. A plasma etch step is used to remove the oxide. A plurality of trenches, e.g., trenches 120, of, for example, about 1.5 to 2 µm in depth are etched into the silicon. A drift region, e.g., drift 125, is left between the trenches. After removing the photo resist and the hard mask, a thick bottom oxide is grown or deposited in the trenches by chemical vapor disposition (CVD). A doped first polysilicon, e.g., polysilicon 155, is deposited and, for example, chemical mechanical polishing (CMP) and/or polysilicon etch back is performed to align the top surface of the polysilicon to Primary Surface 105.

A photolithographic process is used to place photo resist over the bottom source pickup area and a plasma etch step is used to etch, for example, about 0.9 µm of the polysilicon material outside of this area. After cleaning the wafer, a photolithographic process is used to leave a photo resist in all areas outside the region that the thick side wall oxide region that needs to be removed, and a wet etch step is used to etch the oxide. After cleaning the wafer, a gate oxide is grown, followed by growth or deposition of a second doped polysilicon, e.g., polysilicon 150. A chemical mechanical polishing (CMP) and/or polysilicon etch back is performed to align the top surface of the polysilicon to Primary Surface 105. A photolithographic process is used to leave photo resist over the gate pickup area, and a plasma etch step is used to etch, for example, about 0.2 µm of the polysilicon material outside of this area, forming, for example, body contact trench 190.

Subsequently, N+ source implants are used to form the source region, e.g., source region 130, by ion implantation and annealing. Oxide is deposited and chemical mechanical polishing (CMP) and/or oxide etch back is performed to align the oxide surface to Primary Surface 105. Body P implants are used to form the body region, e.g., body region 140. Low temperature oxide (LTO) and borophosphosilicate glass (BPSG) are deposited. A photolithographic process is used to apply photoresist at the region outside the source contact area, and a plasma etch is used to etch oxide outside of this area. A subsequent silicon etch may be used to form self-aligned body contact trench 190 using oxide in the Gate Trench 120 above the Gate Poly 150 as self-aligned hard mask.

The trenches 120 extend from a primary surface 105 of a wafer to a suitable depth. The trenches may terminate in optional epitaxial layer 110, in some embodiments. Epitaxial layer 110 may be formed on substrate 101. Each trench 120 may have one or more polysilicon regions commonly known as gates. Poly 150 is typically coupled to a gate terminal of the MOSFET, for example. Optional poly 155, if present, may be coupled to a DC voltage, for example, a source terminal of the MOSFET. In such a configuration, poly 155 is generally known as or referred to as a "shield gate." A MOSFET comprising an active gate and a shield gate as illustrated is generally known as or referred to as a "split gate" MOSFET. It is to be appreciated that embodiments in accordance with the present invention are well suited to single gate MOSFETS and split-gate MOSFETS, as well as to trench MOSFETS with other gate configurations. For example, embodiments in accordance with the present invention are well suited to hybrid split gate MOSFETs, e.g., as disclosed in co-pending, commonly owned U.S. patent application Ser. No. 13/460,567, filed Apr. 20, 2012, to Bobde et al., entitled "Hybrid Split Gate Semiconductor," which is hereby incorporated herein by reference in its entirety.

In accordance with the conventional art, body contact trench 190 would be used to guide an implant of an ohmic body contact and later filled with source metal, such that the body and the source of the MOSFET are at the same potential. However, such a conventional process tends to produce a body contact that is too large and too close to the channel region, undesirably increasing channel resistance and threshold voltage.

(It is appreciated that current in the body region 140 is not uniform, and that the predominate portions of the channel form near the trenches 120, e.g., where the electric field of the gate 150 is strongest. Accordingly, portions of a body contact closer to the trenches 120 have a greater effect on FET behavior.)

FIG. 1B illustrates a self-aligned implant of an ohmic body contact 170, in accordance with embodiments of the present invention. FIG. 1B illustrates a portion of an exemplary semiconductor device 100. Spacers 160 are formed on the sidewalls of body contact trench 190. Spacers 160 may be any material and thickness suitable as a mask for a subsequent implant of body contact 170. Suitable materials include CVD oxide and/or nitride of, for example, about 300 to 600 Å (0.03 to 0.06 µm) thickness. The spacers 160 are utilized as a mask for the P+ implant, e.g., of boron difluoride ($BF_2$), to form ohmic body contact 170.

In this novel manner, the ohmic body contact implant 170 is lessened in horizontal extent, and is farther from the channel region, in comparison to the conventional art. For example, under the conventional art, an ohmic body contact implant would be a distance $d_1$ from the trench 120. In accordance with embodiments of the present invention, ohmic body contact implant 170 is a greater distance, $d_1$ plus $d_2$, away from the trench. Beneficially, detrimental effects of a body contact are reduced in comparison to the conventional art.

In addition, due to the greater separation of the ohmic body contact implant from the trench in accordance with embodiments of the present invention in comparison to the convention art, the implant may be formed at greater dopant concentrations and/or higher implant energies, in comparison to the convention art. For example, embodiments in accordance with the present invention are well suited to the systems and methods disclosed in co-pending, commonly owned U.S. patent application Ser. No. 14/058,933, filed Oct. 21, 2013, to Terrill and Guan, entitled "Semiconductor Structure with High Energy Dopant Implantation," which is hereby incorporated herein by reference in its entirety. For example, a conventional boron difluoride ($BF_2$) implant may be performed with a dose of about 2e14 $cm^{-2}$ at an energy of about 20 keV. In contrast, embodiments in accordance with the present invention may implant boron difluoride ($BF_2$) to a dose of about 2e14 to 6e14 $cm^{-2}$ with an energy of about 20-60 keV.

Figure 1C:
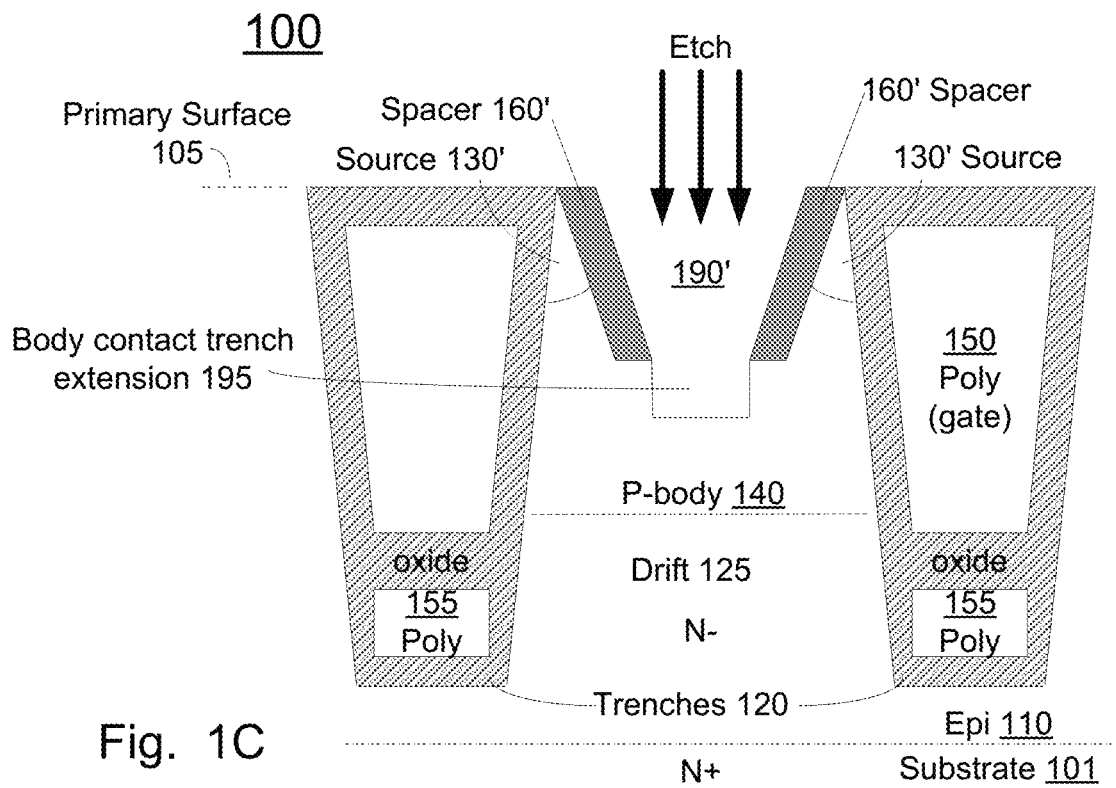
FIG. 1C illustrates a self-aligned etch of a body contact trench extension, in accordance with embodiments of the present invention.
Figure 1D:
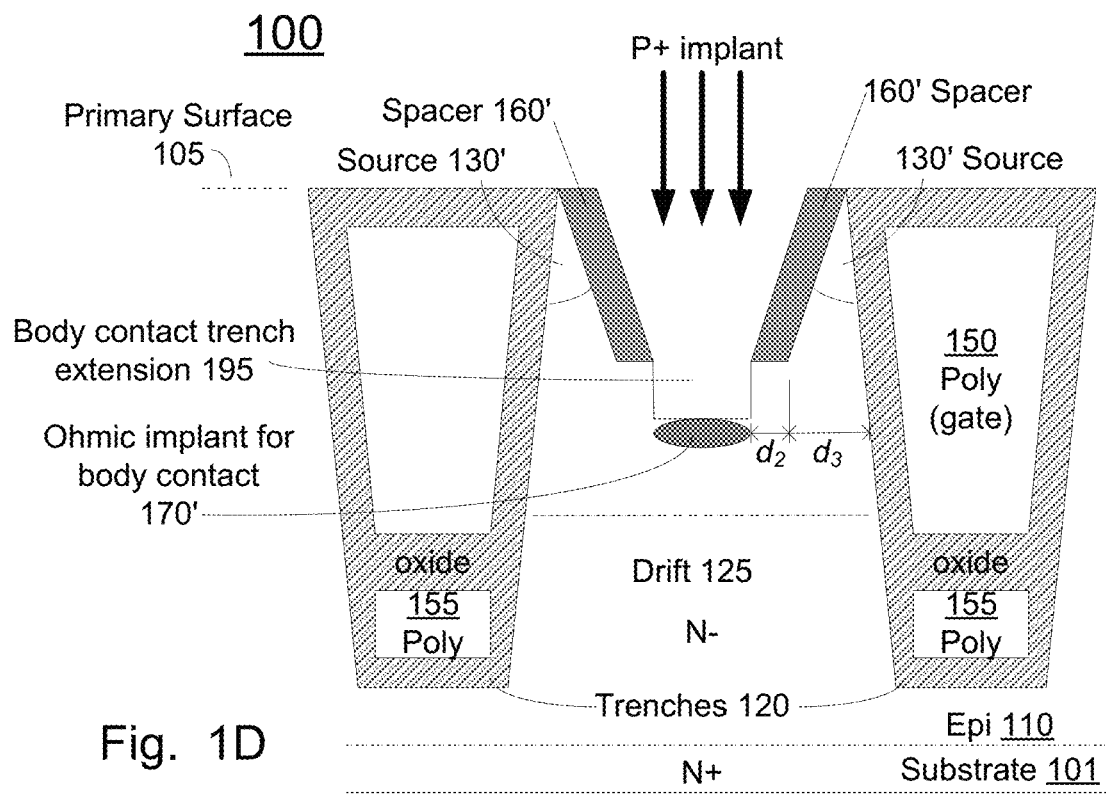
FIG. 1D illustrates a self-aligned implant of an ohmic body contact, in accordance with embodiments of the present invention.

FIGS. 1C and 1D illustrate an exemplary method of forming a trench MOSFET with self-aligned body contact with spacer 100, in accordance with embodiments of the present invention. In FIGS. 1C and 1D, structures indicated by reference numbers with a prime symbol (') are similar to structures in FIGS. 1A and 1B indicated by reference numbers without such symbology. As previously presented, FIG. 1A illustrates a semiconductor wafer 100 in an intermediate state. FIG. 1C illustrates a portion of an exemplary semiconductor device 100. FIG. 1C illustrates a self-aligned extension 195 of body contact trench 190'. Spacers 160' are formed on the sidewalls of body contact trench 190'. Spacers 160' may be any material and thickness suitable as a mask for etching epitaxial layer 110 and a subsequent implant of body contact 170'. Suitable materials include CVD oxide and/or nitride of, for example, about 300 to 600 Å (0.03 to 0.06 μm) thickness.

FIG. 1C illustrates a self-aligned etch of a body contact trench extension 195, in accordance with embodiments of the present invention. As illustrated in FIG. 1C, spacers 160' are utilized to self-align a body contact trench extension 195 through the body contract trench 190'. Any suitable process may be used to form body contact trench extension 195, for example, a plasma etch. Body contact trench extension 195 may be any suitable depth that will not cause a negative effect on breakdown voltage of the body diode, for example, a depth up to about 0.3 μm.

FIG. 1D illustrates a self-aligned implant of an ohmic body contact 170', in accordance with embodiments of the present invention. FIG. 1D illustrates a portion of an exemplary semiconductor device 100. Ohmic body contact 170' is implanted through the body contact trench 190' and through the body contact trench extension 190 into the epitaxial layer 110 at the bottom of the body contact trench extension 190. The spacers 160' are utilized as a mask for the P+ implant, e.g., of boron difluoride ($BF_2$), to form ohmic body contact 170'.

In this novel manner, the ohmic body contact implant 170' is lessened in horizontal extent, and is farther from the channel region, in comparison to the conventional art. For example, under the conventional art, an ohmic body contact implant would be a distance $d_1$ (FIG. 1B) from the trench 120. In accordance with embodiments of the present invention, ohmic body contact implant 170' is a greater distance, $d_1$ plus $d_3$, away from the trench. Due to the sloping nature of the sidewall of trenches 120, the increased depth of ohmic body contact implant 170' results in further increased separation from the trench 120. Accordingly, the dimension $d_3$ is greater than $d_1$ (FIG. 1B). Beneficially, detrimental effects of a body contact are reduced in comparison to the conventional art, and may be improved relative to the embodiment of FIG. 1B.

In addition, in accordance with embodiments of the present invention, body contact trench 190' may be made less deep than, for example, a comparable body contact trench under the conventional art, due to the extra depth available from body contact trench extension 195. For example, the sum of the body contact trench 190' depth plus the depth of the extension 195 may be about the same as a comparable body contact trench under the conventional art. For example, under the conventional art, a body contact trench may be about 0.5 μm below primary surface 105. In accordance with embodiments of the present invention, the combination of the body contact trench 190' depth plus the depth of the extension 195 may be about 0.5 μm below primary surface 105, with the body contact trench 190' being about 0.25 μm below primary surface 105, e.g., less deep than a body contact trench under the conventional art.

For example, body contact trench 190 may be about 0.5 μm deep. An exemplary depth for body contact trench 190' is about 0.25 μm. Body contact trench extension 195 may be about 0.25 μm deep, for example.

Forming a less deep body contact trench may have numerous benefits to the structure and processing of a trench MOSFET, including, for example, decreased processing time in forming the trench, a larger source implant area 130', improved source implant effectiveness, and lower "on" resistance.

After forming the ohmic body contact 170 or 170', the spacers are removed, e.g., by wet etching using hot phosphoric acid ($H_3PO_4$) for nitride spacers, and/or a Buffered Oxide Etch (BOE) or dilute hydrofluoric acid (HF) for oxide spacers. The remaining operations to produce a trench MOSFET are well known. For example, a photolithographic process may be used to deposit a pattern of photoresist in the region outside of the gate pickup area, and plasma etching may be used to etch oxide outside of this area. After cleaning the wafer and using, for example, a dilute hydrogen fluoride (HF) pre-treatment, a titanium layer, and a titanium-nitride layer may be deposited. A rapid thermal anneal may be used to form a titanium-silicide contact. A tungsten layer may be deposited via CVD, which is thick enough to completely fill the contacts. The tungsten may then be etched back to planerize the tungsten such that it only remains inside the contacts. A titanium layer and a thick aluminum layer may be deposited. A photolithographic process may be used to leave a photoresist over the metallization area and a plasma and/or wet etch may be used to remove the aluminum and titanium layer outside of this area.

FIG. 2 illustrates an exemplary method 200, in accordance with embodiments of the present invention. In 210, a plurality of gate trenches, for example, gate trenches 120 as illustrated in FIG. 1A, are formed into a semiconductor substrate. The trenches may be about, for example, 1.5 to 2 μm in depth, in some embodiments. In 220, a body contact trench, for example, body contact trench 190 as illustrated in FIG. 1A or body contact trench 190' as illustrated in FIG. 1C, is formed into the semiconductor substrate in a mesa between the gate trenches.

In 230, spacers, for example spacers 160 as illustrated in FIG. 1B, are deposited on sidewalls of the body contact trench, for example, body contact trench 190 as illustrated in FIG. 1A. The spacers may have a thickness in the range of, for example, 0.03 to 0.06 μm, in some embodiments. The body contact trench may extend, for example, to about 0.2 to 0.6 μm from a primary surface of a wafer, in some embodiments.

In optional 240, a body contact trench extension, for example, body contact trench extension 195 as illustrated in FIG. 1C, is etched into the semiconductor substrate through the body contact trench, for example, body contact trench 190' as illustrated in FIG. 1C, utilizing the spacers to self-align the etch. The body contact trench extension may extend, for example, about 0.1 to 0.2 μm below the bottom of the body contact trench, in some embodiments.

In 250, an ohmic body contact, for example, ohmic body contact 170 as illustrated in FIG. 1B, is implanted into the semiconductor substrate through the body contact trench utilizing the spacers to self-align the implant. In optional 260, the spacers are removed, for example, via wet etching using hot phosphoric acid ($H_3PO_4$) for nitride spacers and/or a Buffered Oxide Etch (BOE) or dilute hydrofluoric acid (HF) for oxide spacers.

Embodiments in accordance with the present invention provide systems and methods for trench metal-oxide-semiconductor field-effect transistors (MOSFETs) with self-aligned body contacts. In addition, embodiments in accordance with the present invention provide systems and methods for trench MOSFETs with self-aligned body contacts having increased separation between a body contact implant and a gate trench. Further, embodiments in accordance with the present invention provide systems and methods for trench MOSFETs with self-aligned body contacts having improved performance at finer, e.g., smaller, inter-gate pitch dimensions. Still further, embodiments in accordance with the present invention provide systems and methods for trench MOSFETs with self-aligned body contacts that are compatible and complementary with existing systems and methods of integrated circuit design, manufacturing and test.

Various embodiments of the invention are thus described. While the present invention has been described in particular embodiments, it should be appreciated that the invention should not be construed as limited by such embodiments, but rather construed according to the below claims.

What is claimed is:

1. A method comprising:
    forming a body contact trench into a semiconductor substrate;
    depositing spacers on sidewalls of said body contact trench; and
    implanting an ohmic body contact into said semiconductor substrate through said body contact trench utilizing said spacers to self-align said implanting.

2. The method of claim 1 further comprising:
    etching a body contact trench extension into said semiconductor substrate through said body contact trench utilizing said spacers to self-align said etching.

3. The method of claim 2 wherein sidewalls of said body contact trench extension are more vertical than said sidewalls of said body contact trench.

4. The method of claim 2 wherein a width of said body contact trench extension is at least a width of said body contact trench.

5. The method of claim 1 further comprising:
    removing said spacers.

6. The method of claim 5 wherein said removing comprises wet etching using hot phosphoric acid ($H_3PO_4$).

7. The method of claim 5 wherein said removing comprises wet etching using BOE or dilute HF.

8. The method of claim 4 wherein a depth of said body contact trench is less than 0.5 µm.

9. A method comprising:
    forming at least two parallel gate trenches into a semiconductor substrate;
    forming a body contact trench into said semiconductor substrate in a mesa between said gate trenches;
    depositing spacers on sidewalls of said body contact trench; and
    implanting an ohmic body contact into said semiconductor substrate through said body contact trench utilizing said spacers to self-align said implanting,
    wherein said ohmic body contact has a maximum horizontal extent that is less than the horizontal extent of the bottom of said body contact trench.

10. The method of claim 9 wherein said spacers are characterized as having a thickness in the range of 0.03 µm to 0.06 µm.

11. The method of claim 10 wherein a horizontal extent of said ohmic body contact implant differs from a lower width at the bottom of said body contact trench by about said thickness of said spacers from each side.

12. The semiconductor device of claim 9 wherein said spacers comprise nitride.

13. The semiconductor device of claim 9 wherein said spacers comprise chemical vapor deposition (CVD) oxide.

14. The semiconductor device of claim 9 further comprising a shield electrode, disposed below and electrically isolated from a gate electrode, in at least one of said gate trenches.

15. A method comprising:
    forming at least two parallel gate trenches into a semiconductor substrate;
    forming a body contact trench into said semiconductor substrate in a mesa between said gate trenches,
    wherein said body contact trench characterized as having a substantially constant sidewall slope to a first depth below a primary surface of said semiconductor substrate;
    depositing spacers on sidewalls of said body contact trench;
    forming a body contact trench extension in said semiconductor substrate extending from the bottom of said body contact trench,
    wherein a sidewall of said body contact trench extension is disjoint with said sidewall slope of said body contact trench; and
    implanting an ohmic body contact implant beneath said body contact trench extension,
    wherein a horizontal extent of said ohmic body contact implant is not greater than a width of said body contact trench at said first depth.

16. The method of claim 15 wherein said spacers are characterized as having a thickness in the range of 0.03 µm to 0.06 µm.

17. The method of claim 15 wherein a horizontal extent of said ohmic body contact implant differs from a lower width at the bottom of said body contact trench by about said thickness of said spacers from each side.

18. The semiconductor device of claim 15 wherein said spacers comprise nitride.

19. The semiconductor device of claim 15 wherein said spacers comprise chemical vapor deposition (CVD) oxide.

20. The semiconductor device of claim 15 further comprising a shield electrode, disposed below and electrically isolated from said gate electrode, in at least one of said gate trenches.

* * * * *